(12) United States Patent
Bedell et al.

(10) Patent No.: US 8,633,097 B2
(45) Date of Patent: Jan. 21, 2014

(54) SINGLE-JUNCTION PHOTOVOLTAIC CELL

(75) Inventors: Stephen W. Bedell, Yorktown Heights, NY (US); Norma E. Sosa Cortes, Yorktown Heights, NY (US); Keith E. Fogel, Yorktown Heights, NY (US); Devendra Sadana, Yorktown Heights, NY (US); Davood Shahrjerdi, Yorktown Heights, NY (US); Brent A. Wacaser, Yorktown Heights, NY (US)

(73) Assignee: International Business Machines Corporation, Armonk, NY (US)

( * ) Notice: Subject to any disclaimer, the term of this patent is extended or adjusted under 35 U.S.C. 154(b) by 726 days.

(21) Appl. No.: 12/713,572

(22) Filed: Feb. 26, 2010

(65) Prior Publication Data
US 2010/0307591 A1 Dec. 9, 2010

Related U.S. Application Data

(60) Provisional application No. 61/185,247, filed on Jun. 9, 2009.

(51) Int. Cl.
*H01L 21/22* (2006.01)
*H01L 21/38* (2006.01)
*H01L 21/385* (2006.01)

(52) U.S. Cl.
USPC ............. 438/558; 257/E21.135; 257/E21.468

(58) Field of Classification Search
USPC ..................... 438/510, 542, 544, 558–564
See application file for complete search history.

(56) References Cited

U.S. PATENT DOCUMENTS

| 2,274,112 A | 2/1942 | Wesley et al. |
| 4,133,724 A | 1/1979 | Hartnagel et al. |
| 4,244,348 A | 1/1981 | Wilkes |

(Continued)

FOREIGN PATENT DOCUMENTS

| JP | 2009141135 A | 6/2009 |
| JP | 2009532918 A | 9/2009 |

(Continued)

OTHER PUBLICATIONS

International Search Report and Written Opinion of the International Searching Authority; International Application No. PCT/US2011/024949; International Filing Date: Feb. 16, 201; Date of Mailing: Oct. 27, 2011; 8 pages.

(Continued)

*Primary Examiner* — Calvin Choi
(74) *Attorney, Agent, or Firm* — Cantor Colburn LLP; Matthew Zehrer

(57) ABSTRACT

A method for forming a single-junction photovoltaic cell includes forming a dopant layer on a surface of a semiconductor substrate; diffusing the dopant layer into the semiconductor substrate to form a doped layer of the semiconductor substrate; forming a metal layer over the doped layer, wherein a tensile stress in the metal layer is configured to cause a fracture in the semiconductor substrate; removing a semiconductor layer from the semiconductor substrate at the fracture; and forming the single junction photovoltaic cell using the semiconductor layer. A single-junction photovoltaic cell includes a doped layer comprising a dopant diffused into a semiconductor substrate; a patterned conducting layer formed on the doped layer; a semiconductor layer comprising the semiconductor substrate located on the doped layer on a surface of the doped layer opposite the patterned conducting layer; and an ohmic contact layer formed on the semiconductor layer.

13 Claims, 6 Drawing Sheets

(56) References Cited

U.S. PATENT DOCUMENTS

| | | | |
|---|---|---|---|
| 4,331,703 A | 5/1982 | Lindmayer | |
| 4,590,095 A | 5/1986 | Park | |
| 4,710,589 A | 12/1987 | Meyers et al. | |
| 4,805,003 A | 2/1989 | Holm et al. | |
| 4,997,793 A | 3/1991 | McClurg | |
| 5,272,114 A | 12/1993 | van Berkum et al. | |
| 5,350,459 A | 9/1994 | Suzuki et al. | |
| 5,668,060 A | 9/1997 | Sato et al. | |
| 5,854,123 A | 12/1998 | Sato et al. | |
| 5,882,987 A | 3/1999 | Srikrishnan | |
| 5,902,505 A | 5/1999 | Finley | |
| 5,985,768 A * | 11/1999 | Speranza et al. | 438/783 |
| 6,033,974 A | 3/2000 | Henley et al. | |
| 6,040,520 A | 3/2000 | Morooka et al. | |
| 6,238,539 B1 | 5/2001 | Joyce et al. | |
| 6,500,732 B1 | 12/2002 | Henley et al. | |
| 6,517,632 B2 | 2/2003 | Minami et al. | |
| 6,612,590 B2 | 9/2003 | Coomer et al. | |
| 6,794,276 B2 | 9/2004 | Letertre et al. | |
| 6,808,952 B1 | 10/2004 | Sniegowski et al. | |
| 6,809,009 B2 | 10/2004 | Aspar et al. | |
| 6,846,698 B2 | 1/2005 | O'Keefe et al. | |
| 6,869,266 B2 | 3/2005 | Coomer et al. | |
| 6,951,819 B2 | 10/2005 | Iles et al. | |
| 6,989,575 B2 | 1/2006 | Gates et al. | |
| 7,022,585 B2 | 4/2006 | Solanki et al. | |
| 7,341,927 B2 | 3/2008 | Atwater, Jr. et al. | |
| 7,427,554 B2 | 9/2008 | Henley et al. | |
| 7,436,066 B2 | 10/2008 | Sonobe et al. | |
| 7,487,684 B2 | 2/2009 | Gupta et al. | |
| 7,488,890 B2 | 2/2009 | Takamoto et al. | |
| 8,124,499 B2 | 2/2012 | Henley et al. | |
| 2002/0094260 A1 | 7/2002 | Coomer et al. | |
| 2003/0198547 A1 | 10/2003 | Coomer et al. | |
| 2004/0235268 A1 | 11/2004 | Letertre et al. | |
| 2005/0072461 A1 | 4/2005 | Kuchinski et al. | |
| 2005/0268963 A1 | 12/2005 | Jordan et al. | |
| 2006/0076559 A1 | 4/2006 | Faure et al. | |
| 2006/0112986 A1 | 6/2006 | Atwater, Jr. et al. | |
| 2006/0144435 A1 | 7/2006 | Wanlass | |
| 2006/0162768 A1 | 7/2006 | Wanlass et al. | |
| 2006/0207648 A1 | 9/2006 | Shima et al. | |
| 2006/0260932 A1 | 11/2006 | Ravkin et al. | |
| 2007/0012353 A1 | 1/2007 | Fischer et al. | |
| 2007/0023777 A1 | 2/2007 | Sonobe et al. | |
| 2007/0029043 A1 | 2/2007 | Henley | |
| 2007/0037323 A1 | 2/2007 | Henley et al. | |
| 2007/0039395 A1 | 2/2007 | Gupta et al. | |
| 2007/0166974 A1 | 7/2007 | Uchino et al. | |
| 2007/0235074 A1 | 10/2007 | Henley et al. | |
| 2007/0249140 A1 * | 10/2007 | Dross et al. | 438/458 |
| 2007/0269960 A1 | 11/2007 | Letertre et al. | |
| 2007/0277873 A1 | 12/2007 | Cornfeld et al. | |
| 2007/0298238 A1 * | 12/2007 | Witvrouw et al. | 428/304.4 |
| 2008/0012121 A1 | 1/2008 | Hara et al. | |
| 2008/0132047 A1 * | 6/2008 | Dunne et al. | 438/527 |
| 2008/0210563 A1 | 9/2008 | Zhang et al. | |
| 2008/0241986 A1 | 10/2008 | Rohatgi et al. | |
| 2008/0245409 A1 | 10/2008 | Varghese et al. | |
| 2008/0268622 A1 * | 10/2008 | Van Gestel | 438/486 |
| 2009/0038678 A1 | 2/2009 | Pan et al. | |
| 2009/0117679 A1 | 5/2009 | Fritzemeier | |
| 2009/0211623 A1 | 8/2009 | Meier et al. | |
| 2009/0277314 A1 | 11/2009 | Henley | |
| 2009/0280635 A1 * | 11/2009 | Mathew et al. | 438/602 |
| 2010/0015750 A1 | 1/2010 | Shen et al. | |
| 2010/0019260 A1 * | 1/2010 | Epler et al. | 257/98 |
| 2010/0112195 A1 | 5/2010 | Kodas et al. | |
| 2010/0307572 A1 | 12/2010 | Bedell et al. | |
| 2010/0307591 A1 | 12/2010 | Bedell et al. | |
| 2010/0310775 A1 | 12/2010 | Bedell et al. | |
| 2011/0048516 A1 | 3/2011 | Bedell et al. | |
| 2011/0048517 A1 | 3/2011 | Bedell et al. | |

FOREIGN PATENT DOCUMENTS

| | | |
|---|---|---|
| KR | 2009025257 A | 3/2009 |
| WO | WO2009061353 A2 | 5/2009 |
| WO | WO2009098109 A1 | 8/2009 |
| WO | WO2009151979 A2 | 12/2009 |
| WO | WO2010072675 A2 | 7/2010 |

OTHER PUBLICATIONS

International Search Report and Written Opinion for International Application No. PCT/US2010/034161 Filed May 10, 2010.

International Search Report and Written Opinion for International Application No. PCT/US2010/037029 Filed Jun. 2, 2010.

F. Dross et al., "Stress-induced large-area lift-off of crystalline Si films" Applied Physics A; Materials Science & Processing, Springer, Berlin, DE, vol. 89, No. 1, Jul. 5, 2007, pp. 149-152.

D. Law, et al., "Lightweight, Flexible, High-Efficiency III-V Multijunction Cells"; This paper appears in: Photvoltaic Energy Conversion, Conference Record of the 20006 IEEE, 4th World Conference on May 2006; pp. 1879-1882.

International Search Report and Written Opinion; International Application No. PCT/EP2011/051545; International Filing Date: Feb. 3, 2011; 14 pages.

Notification Concerning Transmittal of International Preliminary Report on Patentability dated Dec. 22, 2011; International Applicaton No. PCT/US2010/034161; International Filing Date: May 10, 2010; 1 page.

Notification Concerning Transmittal of International Preliminary Report on Patentability; dated Dec. 22, 2011; International Application No. PCT/US2010/37029; International Filing Date: Jun. 2, 2010; 1 page.

International Preliminary Report on Patentability; Written Opinion of the International Searching Authority; International Application No. PCT/US2010/034161; International Filing Date: May 10, 2010; 8 pages.

International Preliminary Report on Patentability; Written Opinion of the International Searching Authority; International Application No. PCT/US2010/37029; International Filing Date: Jun. 2, 2010; 7 pages.

Y. Tsunomura et al., 22%-Efficiency HIT Solar cell, Technical Digest of the International PVSEC-17, 2007, pp. 387-390, Fukuoka.

U.S. Appl. No. 61/185,247, filed Jun. 6, 2009.

M. Brede et al., Brittle crack propagation in silicon single crystals, Journal of Applied Physics, 1991, pp. 758-771, 70 (2), American Institute of Physics.

K. Wasmer et al., Cleavage Fracture of Brittle Semiconductors from the Nanometer to the Centimeter Scale, Advanced Engineering Materials, 2005, pp. 309-317, vol. 7, No. 5.

M.V. Sullivan et al., Electroless Nickel Plating for Making Ohmic Contacts to Silicon, Journal of the Electrochemical Society, 1957, pp. 226-230, vol. 104, No. 4.

J.J. Schermer et al., Epitaxial Lift-Off for large area thin film III/V devices, Phys. Stat. Sol., 2005, pp. 501-508, (a) 202, No. 4.

C. Scheck et al., Evolution of interface properites of electrodeposited Ni/GaAs(001) contacts upon annealing, Journal of Applied Physics, 2004, pp. 6549-6551, vol. 95, No. 11, American Institute of Physics.

Bedell et al., US Nonprovisional Patent Application entitled, Spalling for a Semiconductor Substrate, U.S. Appl. No. 12/713,560, filed Feb. 26, 2010.

T. Hjort et al., Gallium arsenide as a mechanical material, J. Micromech. Microeng., 1994, pp. 1-13, 4.

M. Konagai et al., High Efficiency GaAs thin film solar cells by peeled firm technology, Journal of Crystal Growth, 1978, pp. 277-280, 45, North-Holland Publishing Company.

J.F. Geisz et al., High-efficiency GaInP/GaAs/InGaAs triple-junction solar cells grown inverted with a metamorphic bottom junction, Applied Physics, 2007, 023502, 91, American Institute of Physics.

H. Yamaguchi et al., Investigation of Non-Ohmic Properties for Thin Film InGaP/GaAs Solar Cells, IEEE 4th World Conf on Photovoltaic Energy Conv, May 2006, pp. 1805-1807, vol. 2, IEEE.

(56) References Cited

OTHER PUBLICATIONS

M. Wanlass et al., Monolithic, Ultra-Thin, GaInP/GaAs/GaInAs Tandem Solar Cells, IEEE 4th World Conference on Photovoltaic Energy Cony, May 2006, pp. 729-732, vol. 2, IEEE.

K. Bock et al., New Manufacturing Concepts for Ultra-Thin Silicon and Gallium Arsenide Substrates, International Conf. on Compound Semiconductor Mfg., 2003, GaAsMANTECH Inc.

V.P. Ganesh et al., Overview and Emerging Challenges in Mechanical Dicing of Silicon Wafers, Electronics Packaging Technology Conference, Dec. 2006, pp. 15-21, EPTC.

F. Dross et al., Stress-induced large-area lift-off of crystalline Si films, Applied Phsyics, 2007, pp. 149-152, A 89.

Z.M. Zhou et al., The evaluation of Young's modulus and residual stress of nickel films by microbridge testings, Measurement Science and Technology, 2004, pp. 2389-2394, vol. 15, IOP Publishing.

K.J. Weber, Transfer of monocrystalline Si films for thin film solar cells, 2004, Austrailian National University.

M.R. Page et al., Well Passivated a-Si:H Back Contacts for Double-Heterojunction Silicon Solar Cells, IEEE 4th World Conf on Photovoltaic Energy Conv, May 2006, pp. 1485-1488, vol. 2, IEEE.

US Provisional Patent Application filed Jun. 9, 2009. U.S. Appl. No. 61/185,247.

Bedell et al., US Nonprovisional Patent Application entitled, Heterojunction III-V Photovoltaic Cell Fabrication, U.S. Appl. No. 12/713,584, filed Feb. 26, 2010.

Bedell, et al., US Nonprovisional Patent Application entitled, Multijunction Photovoltaic Cell Fabrication, U.S. Appl. No. 12/713,592, filed Feb. 26, 2010.

Bedell et al., US Nonprovisional Patent Application entitled, Multijunction Photovoltaic Cell Fabrication, U.S. Appl. No. 12/713,581, filed Feb. 26, 2010.

\* cited by examiner

200

| 202 |
|---|
| 201 |

| 401 |
| 302 |
| 301 |
| 201 |

| 602 |
|---|
| 601 |
| 501 |
| 301 |

| 603a | 603b | 603c | 603c | 603d |

FIG. 6

SINGLE-JUNCTION PHOTOVOLTAIC CELL

CROSS-REFERENCE TO RELATED APPLICATION

This application claims the benefit of U.S. Provisional Application No. 61/185,247, filed Jun. 9, 2009. This application is also related to Ser. Nos. 12/713,584, 12/713,592, 12/713,581 and 12/713,560, each assigned to International Business Machines Corporation (IBM) and filed on the same day as the instant application, all of which are herein incorporated by reference in their entirety.

FIELD

The present invention is directed to semiconductor substrate fabrication using stress-induced substrate spalling.

DESCRIPTION OF RELATED ART

Cost constraints tend to exclude the use of compound semiconductor substrates for all but the most demanding photovoltaic (PV) applications, such as satellite and space-based PV systems, as compound semiconductor substrates tend to be relatively expensive. Reducing waste of a compound substrate during processing is therefore desirable. An example compound semiconductor substrate is gallium arsenide (GaAs), which may be used as the base substrate in high efficiency multi-junction cells. The high optical absorption of GaAs ensures that less than about 10 microns of thickness of GaAs is sufficient to capture photons from the solar spectrum; the remaining substrate material serves as a carrier, and is not necessary for the functioning of a PV cell.

SUMMARY

In one aspect, a method for forming a single junction photovoltaic cell includes forming a dopant layer on a surface of a semiconductor substrate; diffusing the dopant layer into the semiconductor substrate to form a doped layer of the semiconductor substrate; forming a metal layer over the doped layer, wherein a tensile stress in the metal layer is configured to cause a fracture in the semiconductor substrate; removing a semiconductor layer from the semiconductor substrate at the fracture; and forming the single-junction photovoltaic cell using the semiconductor layer.

In one aspect, a single-junction photovoltaic cell includes a doped layer comprising a dopant diffused into a semiconductor substrate; a patterned conducting layer formed on the doped layer; a semiconductor layer comprising the semiconductor substrate located on the doped layer on a surface of the doped layer opposite the patterned conducting layer; and an ohmic contact layer formed on the semiconductor layer.

Additional features are realized through the techniques of the present exemplary embodiment. Other embodiments are described in detail herein and are considered a part of what is claimed. For a better understanding of the features of the exemplary embodiment, refer to the description and to the drawings.

BRIEF DESCRIPTION OF THE SEVERAL VIEWS OF THE DRAWINGS

Referring now to the drawings wherein like elements are numbered alike in the several FIGURES:

FIG. 2 illustrates an embodiment of a semiconductor substrate with a dopant layer.

FIG. 4 illustrates an embodiment of a semiconductor substrate with a stressed metal layer.

Figure 6:
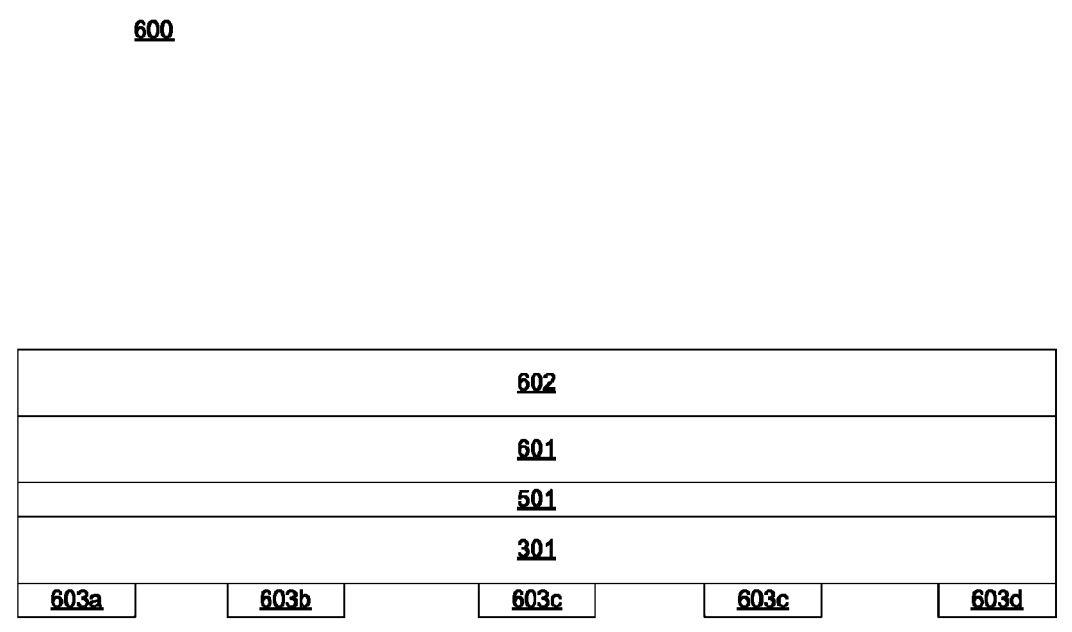

FIG. 6 illustrates an embodiment of a single-junction PV cell.

DETAILED DESCRIPTION

Embodiments of systems and methods for forming a single junction PV cell are provided, with exemplary embodiments being discussed below in detail. A method for forming relatively thin layer of a compound semiconductor substrate, such as GaAs, with relatively little waste of the substrate is needed. Spalling provides for a method of forming a relatively thin semiconductor substrate layer from a larger wafer or ingot of the semiconductor substrate in a cost-effective manner, reducing waste of the substrate material. The relatively thin layer may be less than about 50 microns (μm) thick in some embodiments, and may be used to form the single junction PV cell.

Substrate spalling induces a fracture in a substrate by applying one or more tensile stressed metal layers to the substrate. When spalling is used on a GaAs substrate having a <111> or <100> surface crystallization orientation, the fracture trajectory may be unstable, leading to difficult and inconsistent layer removal. However, the use of a <110> surface-oriented compound semiconductor substrate has relatively consistent substrate spalling characteristics compared to <111> and <100> surface crystallization orientations.

Figure 1:
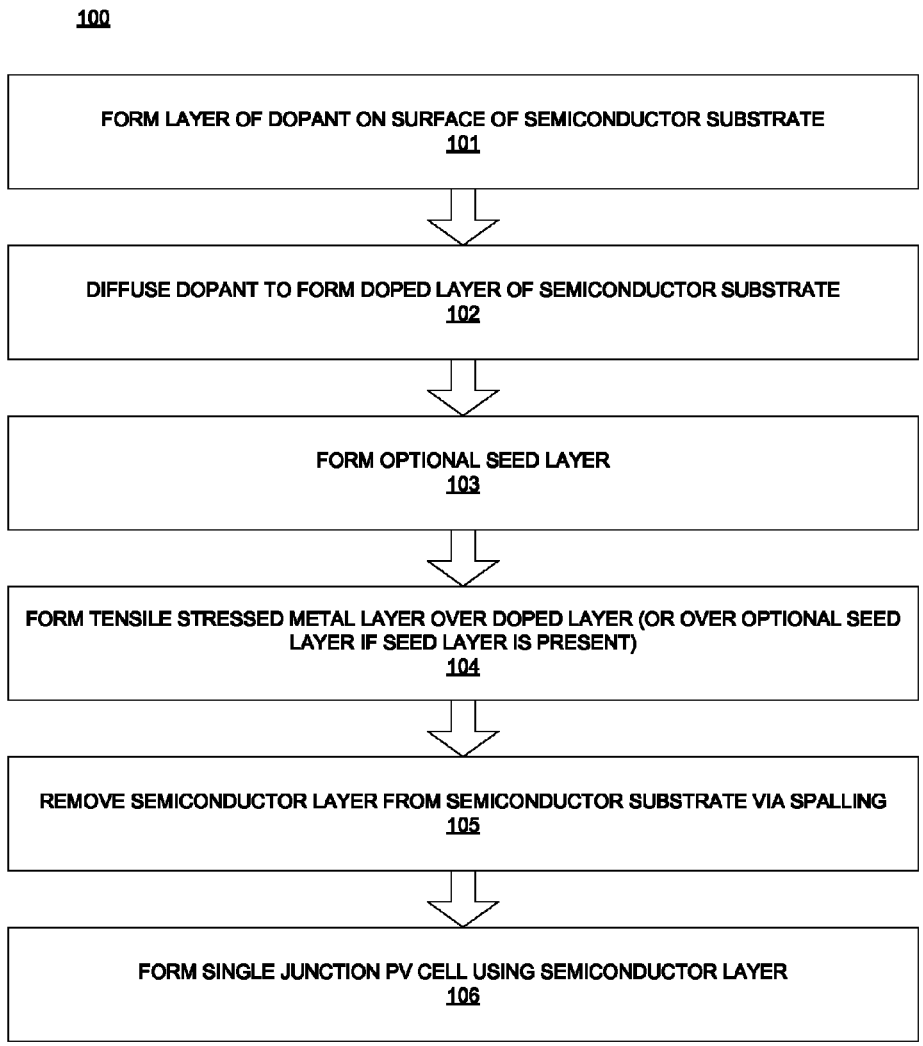
FIG. 1 illustrates an embodiment of a method for forming a single-junction PV cell.
Figure 2:
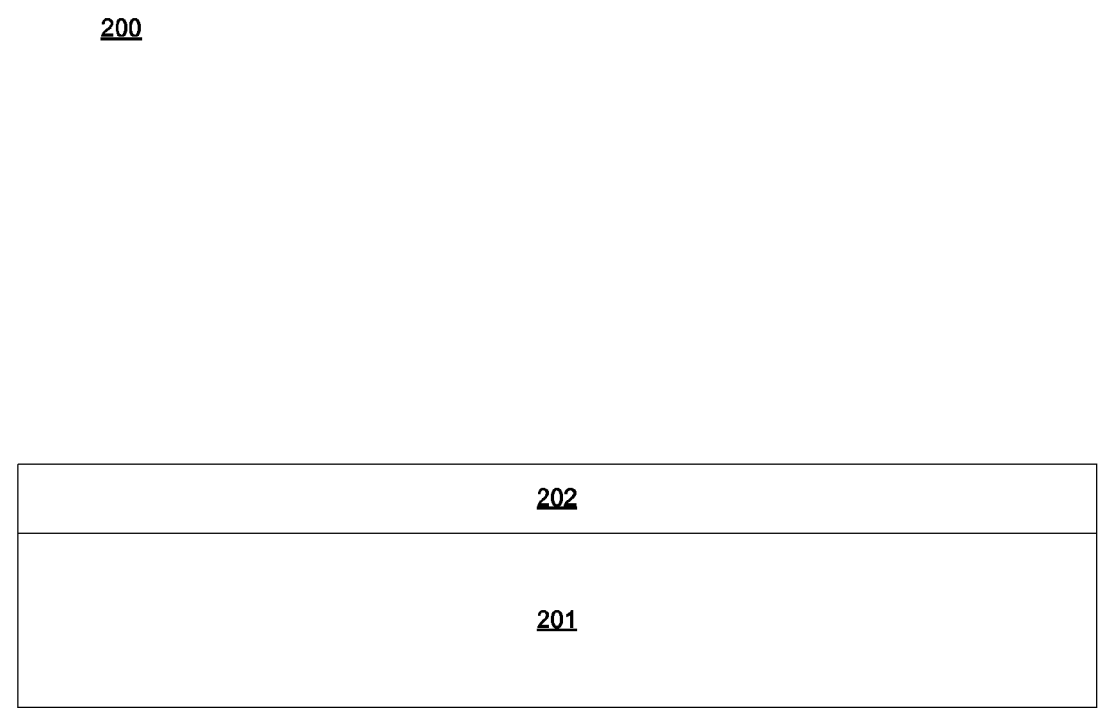

FIG. 1 illustrates an embodiment of a method 100 for formation of a single junction PV cell. The semiconductor substrate may comprise an n-type or a p-type semiconductor substrate. The compound semiconductor substrate may comprise a compound semiconductor substrate, such as GaAs, in some embodiments, and may have a <110> surface crystallization orientation in some embodiments. FIG. 1 is discussed with reference to FIGS. 2-6. In block 101, a dopant layer 202 is formed on semiconductor substrate 201, as shown in FIG. 2. Dopant layer 202 may be formed by any appropriate method, including but not limited to electroplating, CVD, PVD, or screen printing. The dopant layer 202 may comprise zinc (Zn), or Zn-containing layers in some embodiments.

Figure 3:
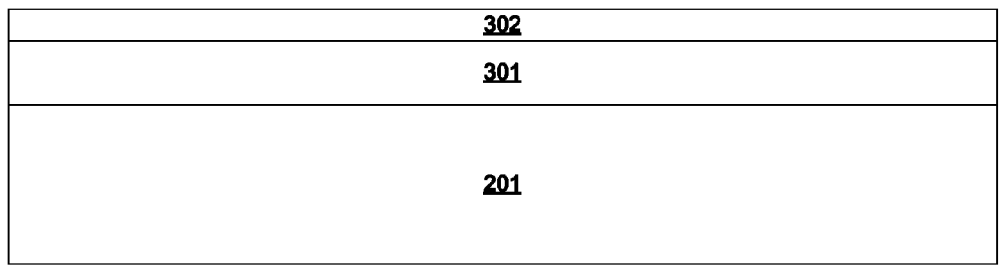
FIG. 3 illustrates an embodiment of a semiconductor substrate with a doped layer.

In block 102, dopant layer 202 is diffused into semiconductor substrate 201, resulting in doped layer 301 as shown in FIG. 3. Doped layer 301 may have the same doping type (p- or n-type) as the doping type of substrate 201, or it may be opposite. Doped layer 301 may comprise a back surface field (BSF) or an electrical contact layer for a single junction PV cell. Doped layer 301 may also serve as a seed layer in some embodiments. Alternately, in block 103, an optional seed layer 302 may be formed as is shown in FIG. 3 using any appropriate technique, including but not limited to chemical vapor deposition (CVD), physical vapor deposition (PVD) or immersion plating (such as palladium immersion plating), to prepare the surface of the substrate 201 for subsequent chemical plating using electrochemical or electroless plating techniques. The seed layer 302 is optional; if the substrate comprises an n-type semiconductor substrate 201, seed layer 302 may not be present. In some embodiments, the seed layer 302 may be deposited on dopant layer 202 prior to diffusion step 102; in other embodiments, the seed layer 302 may be deposited onto doped layer 301 after diffusion step 102. The seed layer 302 may comprise one or more metallic layers. The seed layer 302 may form an ohmic contact to the doped layer 301, and/or serve as an etch-stop layer (such as titanium (Ti)) to protect underlying layers during removal of the stressed metal layer 401 during post-processing (discussed below with respect to FIG. 6).

Figure 4:
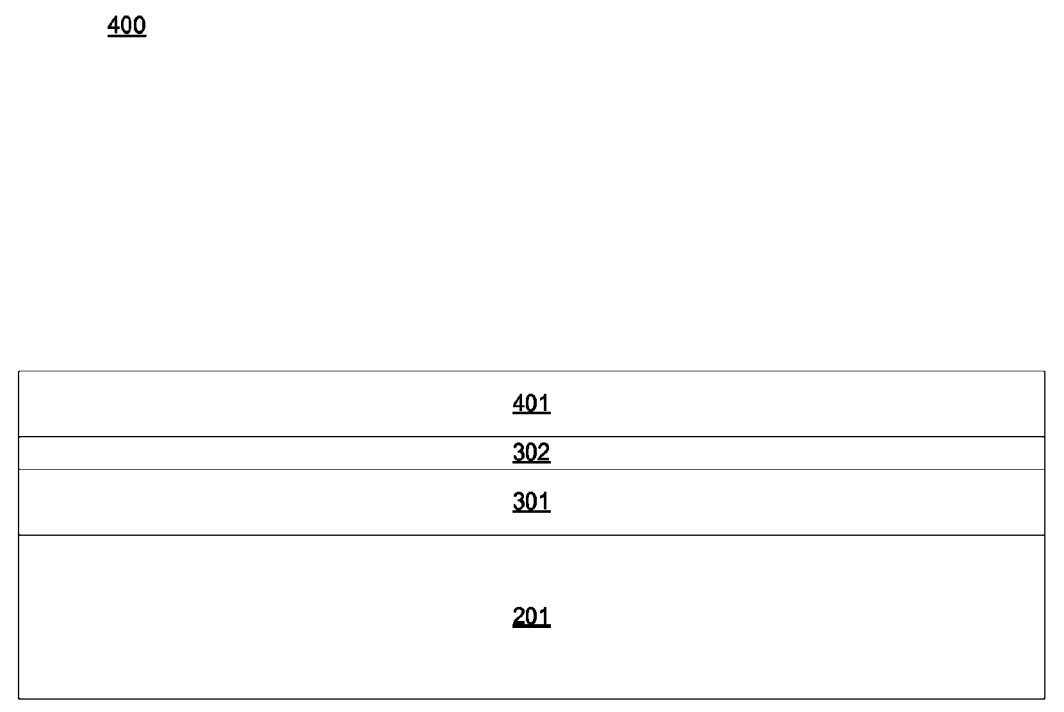

In block 104, a layer of stressed metal 401 is formed over doped layer 301 (or optional seed layer 302 in embodiments in which seed layer 302 is present), as shown in FIG. 4. Stressed metal 401 may be formed by electroplating, and may comprise nickel (Ni) in some embodiments. In some embodiments the atoms comprising the doped layer 301 may form an alloy with the stressed metal 401, for example, NiZn. In other embodiments doped layer 301 may serve as both a doped layer 301 and as stressed metal 401 (e.g., doped layer 301 may comprise tensile stressed Zn). The stressed metal layer 401 may be greater than about 2 μm thick in some embodiments, and between 3 μm and 10 μm in some exemplary embodiments. In embodiments in which substrate 201 comprises an n-type semiconductor substrate, stressed metal 401 may be directly electroplated on the surface of substrate 201, with no need for seeding. The tensile stress contained in stressed metal 401 may be greater than about 100 megapascals (MPa) in some embodiments.

Figure 5:
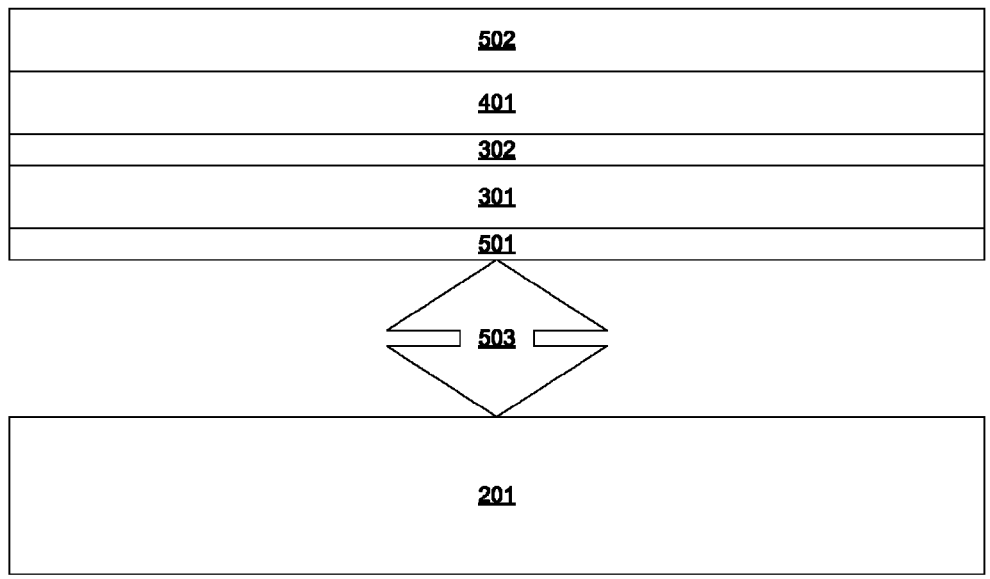
FIG. 5 illustrates an embodiment of a semiconductor substrate after spalling.

In block 105, stressed metal 401, optional seed layer 302, doped layer 301, and semiconductor layer 501 are spalled from semiconductor substrate 201, as shown in FIG. 5. Spalling may comprise controlled or spontaneous spalling. Controlled spalling may be performed by adhering a flexible handle layer 502 onto stressed metal layer 401, using flexible handle layer 502 and the tensile stress contained in stressed metal 401 to initiate fracture 503 within substrate 201, and removing semiconductor layer 501, optional seed layer 302, doped semiconductor layer 301, tensile stressed layer 401, and flexible handle layer 502 from substrate 201. The handle layer 502 may comprise a membrane of plastic, polymer, glass or metal, and may be water soluble in some embodiments. Handle layer 502 may also comprise a specialized adhesive tape that is thermally, optically or chemically-releasable from stressed metal 401. Alternately, in spontaneous spalling, the tensile stress in stressed metal layer 401 may self-initiate fracture 503, separating semiconductor layer 501 from substrate 201 without the need for handle layer 502. Semiconductor layer 501 may be less than about 50 microns thick in some embodiments. Due to the tensile stress in metal layer 401, the semiconductor layer 501 and doped semiconductor layer 301 may possess residual compressive strain after spalling in some embodiments. The magnitude of the strain contained in semiconductor layer 501 and doped semiconductor layer 301 may be controlled by varying the thickness and/or stress of the metal layer 401, either before or after spalling. The optical properties of a PV cell built using semiconductor layer 501 may be tuned by adjusting the amount of strain in semiconductor layer 501.

In block 106, a single junction PV cell 600 is formed using semiconductor layer 501. Contact layer 601 is deposited onto the semiconductor layer 501. Contact layer 601 may comprise a material appropriate for forming an ohmic contact for semiconductor layer 501. For example, contact layer 601 may comprise a GePd or GeAu alloy if semiconductor layer 501 comprises n-type GaAs. A handling substrate 602 is then formed on contact layer 601. The handling substrate 602 may comprise a metallic foil, ceramic, glass or polymer-based material, and may be electrically conducting. Handle layer 502 and stressed metal 401 are then removed. The stressed metal 401 may be selectively etched chemically, or may be removed by reactive ion etching. In a preferred embodiment, a solution of aqua regia (a $HNO_3$ and HCl mixture) may be used for etching of stressed metal 401; in such an embodiment, a seed layer 302 comprising Ti may act as an etch-stop layer to protect doped layer 301 and semiconductor layer 501. Patterned contact layer 603a-d may be formed by patterning optional seed layer 302 and/or doped layer 301 using standard lithography to etch any excess metal. Alternately, patterned contact layer 603a-d may be formed by deposition or screen-printing an appropriate metallic material on the surface of optional seed layer 302 or doped layer 301 after removal of stressed metal 401. Semiconductor layer 501 may contain an amount of compressive strain induced in the semiconductor layer 501 by the stress in metal layer 401; the amount of strain in semiconductor layer 501 may determine the optical properties of single junction PV cell 600.

In an exemplary embodiment, substrate 201 may comprise <110> n-type phosphorus-doped GaAs, having a resistance of about 10 Ohm/cm. The substrate 201 may be an ingot that is about 43 mm in diameter. The stressed metal layer 401 may be formed by electroplating substrate 201 with Ni using a plating solution comprising 300 g/l $NiCl_2$ and 20 g/l boric acid at 25° C. for 5 minutes with a plating current of 0.6 Amps. The Ni stressed metal layer 401 that is formed on substrate 201 may spontaneously initiate fracture (i.e., spontaneous spalling) from the edge of the substrate 201, separating a semiconductor layer 501 of GaAs from the substrate 201. The semiconductor layer 501 of GaAs may be about 10 μm thick, with a Ni layer 401 that is about 5 μm thick. Semiconductor layer 501 may be used to form a single junction PV cell 600.

The technical effects and benefits of exemplary embodiments include formation of a relatively thin layer of a compound semiconductor substrate for use in a single junction PV cell in a relatively cost-effective manner.

The terminology used herein is for the purpose of describing particular embodiments only and is not intended to be limiting of the invention. As used herein, the singular forms "a", "an", and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

The invention claimed is:

1. A method for forming a single junction photovoltaic cell, the method comprising:
    forming a dopant layer on a surface of a semiconductor substrate;
    forming a metalic seedlayer on the dopant layer;

diffusing the dopant layer into the surface of the semiconductor substrate to form a doped layer of the semiconductor substrate;

forming a tensile-stressed metal layer on the metallic seed layer;

causing a fracture in the semiconductor substrate underneath the doped layer by the tensile-stressed metal layer;

removing a spalled layer, the spalled layer comprising the doped layer and an undoped layer of the semiconductor substrate located above the fracture, from the semiconductor substrate at the fracture; and forming the single-junction photovoltaic cell using the spalled layer by removing the tensile-stressed metal layer from the spalled layer, and using the metallic seed layer as an etch stop layer during the removal of the tensile-stressed metal layer from the spalled layer.

2. The method of claim 1, wherein the dopant layer comprises zinc.

3. The method of claim 1, wherein the tensile-stressed metal layer comprises nickel.

4. The method of claim 3, wherein the tensile-stressed metal layer is greater than about 2 microns thick.

5. The method of claim 1, wherein forming the tensile-stressed metal layer comprises electroplating.

6. The method of claim 1, wherein the semiconductor substrate comprises gallium arsenide having a <110> surface crystallization orientation.

7. The method of claim 1, wherein the spalled layer is under a compressive strain, the compressive strain being induced by the tensile-stressed metal layer.

8. The method of claim 1, wherein removing the spalled layer from the semiconductor substrate at the fracture comprises adhering a handle layer to the tensile-stressed metal layer, the handle layer comprising one of a membrane of plastic, polymer, glass, or metal, or an adhesive tape.

9. The method of claim 1, wherein the spalled layer is less than about 50 microns thick.

10. The method of claim 1, wherein forming the single junction photovoltaic cell using the spalled layer comprises:

forming an ohmic contact layer on the undoped layer of the semiconductor substrate; and forming a handling substrate layer over the ohmic contact layer, the handling substrate comprising a conductive material comprising one of a metallic foil, glass, or ceramic material.

11. The method of claim 10, wherein forming the single junction photovoltaic cell using the spalled layer further comprises:

forming a patterned contact layer on a surface of the doped layer opposite the undoped layer of the semiconductor substrate.

12. The method of claim 1, wherein the metallic seed layer comprises titanium.

13. The method of claim 1, further comprising patterning the metallic seed layer to form a plurality of contacts to the single junction photovoltaic cell during formation of the single junction photovoltaic cell that is formed using the spalled layer.

* * * * *